United States Patent
Flynn et al.

(10) Patent No.: US 8,924,778 B2
(45) Date of Patent: Dec. 30, 2014

(54) METHOD TO SYNCHRONIZE A REPLACEMENT CONTROLLER'S FIRMWARE VERSION TO THE NATIVE CONFIGURATION DATABASE VERSION ON A SIMPLEX ARRAY

(75) Inventors: Patrick S. Flynn, Wichita, KS (US);
Vaughn J. Huffman, Wichita, KS (US);
Dean A. Lang, Wichita, KS (US)

(73) Assignee: LSI Corporation, San Jose, CA (US)

( * ) Notice: Subject to any disclaimer, the term of this patent is extended or adjusted under 35 U.S.C. 154(b) by 865 days.

(21) Appl. No.: 12/981,355

(22) Filed: Dec. 29, 2010

(65) Prior Publication Data
US 2012/0173953 A1 Jul. 5, 2012

(51) Int. Cl.
G06F 11/00 (2006.01)
G06F 9/445 (2006.01)
G06F 11/10 (2006.01)
H03M 13/09 (2006.01)

(52) U.S. Cl.
CPC ............ *G06F 8/665* (2013.01); *G06F 11/1004* (2013.01); *H03M 13/09* (2013.01)
USPC ........................ 714/6.32; 714/6.21

(58) Field of Classification Search
CPC ....... G06F 8/65; G06F 11/1433; G06F 11/20; G06F 3/0635; G06F 3/0683; H03M 13/09
USPC ................. 714/6.21, 6.22, 6.3, 6.32
See application file for complete search history.

(56) References Cited

U.S. PATENT DOCUMENTS

| | | | |
|---|---|---|---|
| 6,009,274 A | 12/1999 | Fletcher et al. | |
| 6,345,368 B1 * | 2/2002 | Bergsten | 714/11 |
| 6,675,258 B1 * | 1/2004 | Bramhall et al. | 711/114 |
| 6,904,457 B2 | 6/2005 | Goodman | |
| 7,028,177 B2 * | 4/2006 | Schultz et al. | 713/100 |
| 7,080,243 B2 | 7/2006 | Ramiz et al. | |
| 7,246,266 B2 | 7/2007 | Sneed et al. | |
| 7,500,134 B2 * | 3/2009 | Madnani et al. | 714/6.2 |
| 7,870,379 B2 * | 1/2011 | Krieger et al. | 713/100 |
| 8,046,631 B2 * | 10/2011 | Jibbe et al. | 714/6.3 |
| 8,296,752 B2 * | 10/2012 | Chang et al. | 717/168 |
| 2008/0295087 A1 * | 11/2008 | Kang et al. | 717/168 |

* cited by examiner

*Primary Examiner* — Bryce Bonzo
*Assistant Examiner* — Elmira Mehrmanesh

(57) ABSTRACT

Disclosed are a method and a simplex array controller device that synchronize firmware revisions between an original, native, storage array controller in a single controller storage array system (i.e., a simplex array controller) and a replacement storage array controller that replaces the original, native, storage array controller. An embodiment may create and store an original firmware code image containing a copy of the firmware revision information running on an original simplex array controller along with controller and firmware revision identification off-board of the original array controller on a firmware repository storage device. The firmware repository storage device may be one of the storage devices selected from the array of storage devices controlled by the original array controller. When the original array controller is replaced by the replacement array controller, such as when the original array controller has failed, the replacement array controller may compare the firmware revision information of the firmware currently running on the array controller with the firmware revision information stored in the original firmware code image, and, if the revision information does not match, replace/overwrite the firmware revision on the replacement controller with the firmware revision stored in the firmware code image.

20 Claims, 9 Drawing Sheets

100 BLOCK DIAGRAM OF A STORAGE ARRAY SYSTEM WITH THE ORIGINAL SIMPLEX STORAGE ARRAY CONTROLLER FOR AN EMBODIMENT

150 BLOCK DIAGRAM OF A STORAGE ARRAY SYSTEM WITH A REPLACEMENT SIMPLEX STORAGE ARRAY CONTROLLER FOR AN EMBODIMENT

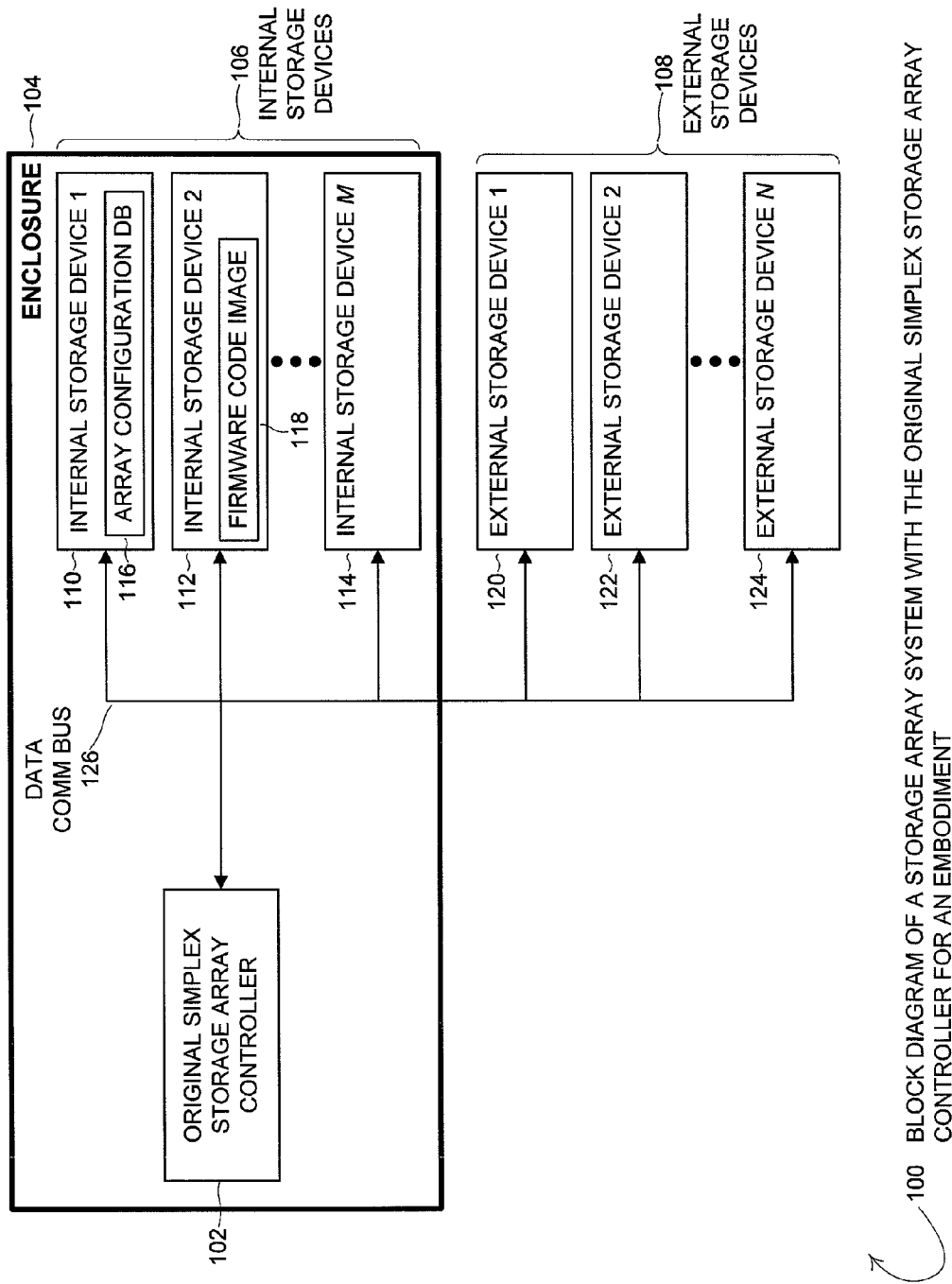

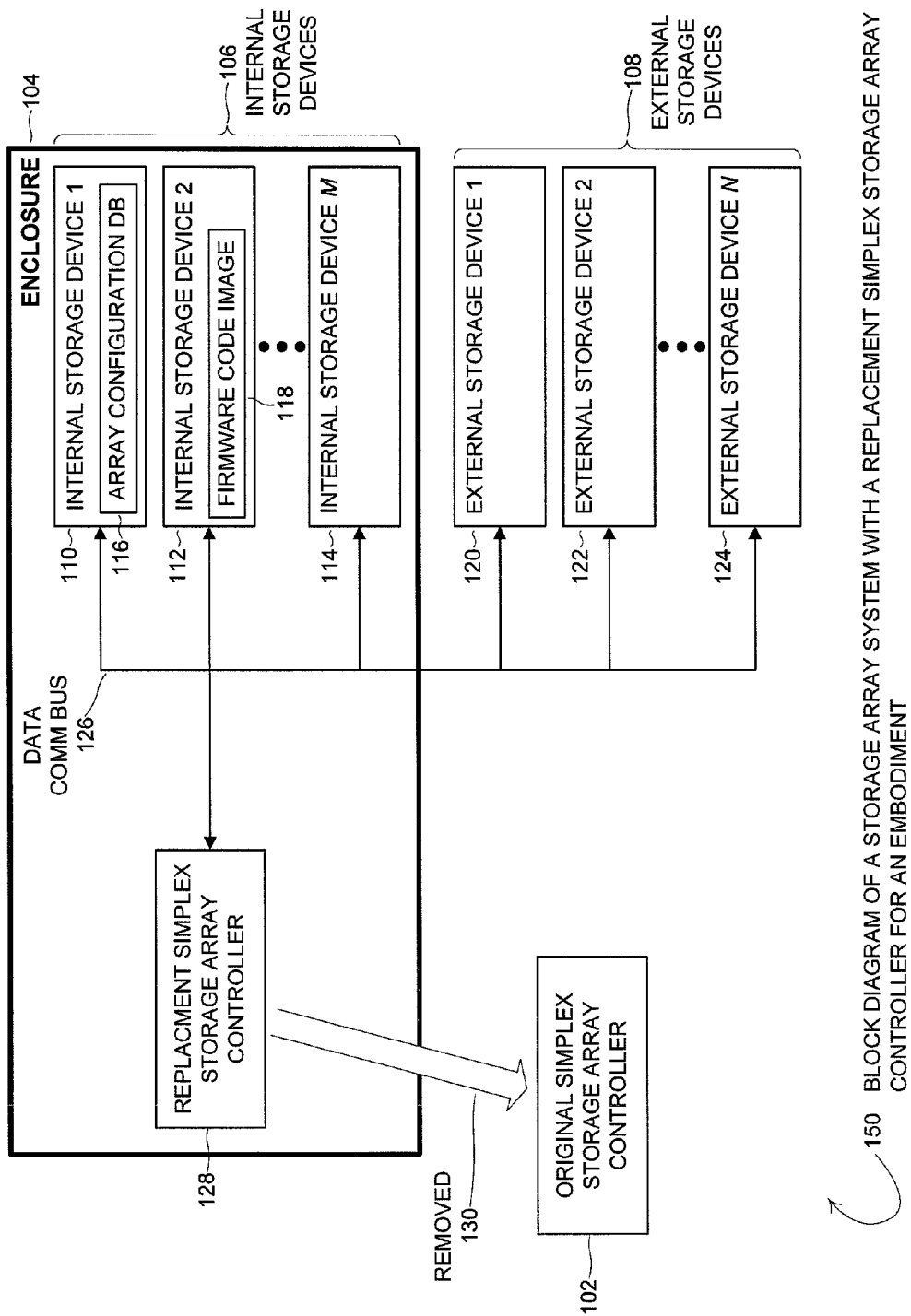

200 BLOCK DIAGRAM OF A FORMAT OF A FIRMWARE CODE IMAGE FOR AN EMBODIMENT

600 DETAILED OPERATION OF AN EMBODIMENT FOR CREATING & STORING A FIRMWARE (FW) CODE IMAGE INCLUDING CRC STORAGE VALIDATION

METHOD TO SYNCHRONIZE A REPLACEMENT CONTROLLER'S FIRMWARE VERSION TO THE NATIVE CONFIGURATION DATABASE VERSION ON A SIMPLEX ARRAY

BACKGROUND OF THE INVENTION

A typical modern computing system utilizes some form of computer readable storage media for long term, non-volatile, storage of data and programs. To enhance reliability and/or speed of operation of storage media for a computer system, multiple storage devices were arranged as an "array" of storage devices that acted together to provide long term, non-volatile storage for a computer system. One well known storage device array configuration is the Redundant Array of Independent Disks (RAID). A RAID system may be configured in a wide variety of different sub-configurations and still be considered a RAID in accord with the standards and specifications that define RAID systems. Typically, storage array systems, including RAID systems, have one, or more, array controller devices to control and coordinate the operation of the array of storage devices. When a single array controller device controls an array of storage devices, the single array controller may be referred to as a "simplex" array controller to indicate that the system is a simple, single controller system.

SUMMARY OF THE INVENTION

An embodiment of the present invention may comprise a method to synchronize firmware of a replacement simplex array controller with firmware of an original simplex array controller comprising: creating and storing by the original simplex array controller on a firmware repository storage device an original controller firmware code image that contains an original controller revision of firmware that is running on the original simplex array controller and original controller firmware revision information about the original controller revision of firmware, the firmware repository storage device being one storage device of an array of storage devices controlled by the original simplex array controller; replacing the original simplex array controller with the replacement simplex array controller; determining by the replacement simplex array controller that the replacement simplex array controller is running different firmware than the original simplex array controller was running by comparing replacement controller firmware revision information of firmware currently running on the replacement simplex array controller with the original controller firmware revision information stored in the original controller firmware code image; and replacing the currently running revision of firmware on the replacement simplex array controller with the original controller revision of firmware stored in the original controller firmware code image.

An embodiment of the present invention may further comprise a simplex array storage controller that synchronizes firmware between a replacement simplex array controller with firmware of an original simplex array controller for a storage array controlled by simplex array controller comprising: a firmware code image creation and storage sub-system that creates and stores on a firmware repository storage device an original controller firmware code image that contains an original controller revision of firmware that is running on the simplex array controller when the simplex array controller is determined to be operating as the original simplex array controller and original controller firmware revision information about the original controller revision of firmware running on the simplex array controller when the simplex array controller is determined to be operating as the original simplex array controller, the firmware repository storage device being one storage device of an array of storage devices controlled by the simplex array controller; a synchronize and update firmware sub-system that determines that the simplex array controller, when the simplex array controller is determined to be operating as the replacement simplex array controller, is running different firmware than the original simplex array controller was running when the original controller firmware image was created and stored by comparing replacement controller firmware revision information of firmware currently running on the replacement simplex array controller when the simplex array controller is determined to be operating as the replacement simplex array controller with the original controller firmware revision information stored in the original controller firmware code image, and that replaces the currently running revision of firmware on the simplex array controller when the simplex array controller is determined to be operating as the replacement simplex array controller with the original controller revision of firmware stored in the original controller firmware code image.

BRIEF DESCRIPTION OF THE DRAWINGS

In the drawings,

FIG. 1A is a block diagram of an embodiment of a storage array system with an original simplex storage array controller prior to replacement of the original simplex storage array controller.

FIG. 1B is a block diagram of the embodiment of the storage array system of FIG. 1A with the original simplex storage array controller being replaced by a replacement simplex storage array controller.

DETAILED DESCRIPTION OF THE EMBODIMENTS

Figure 1C:
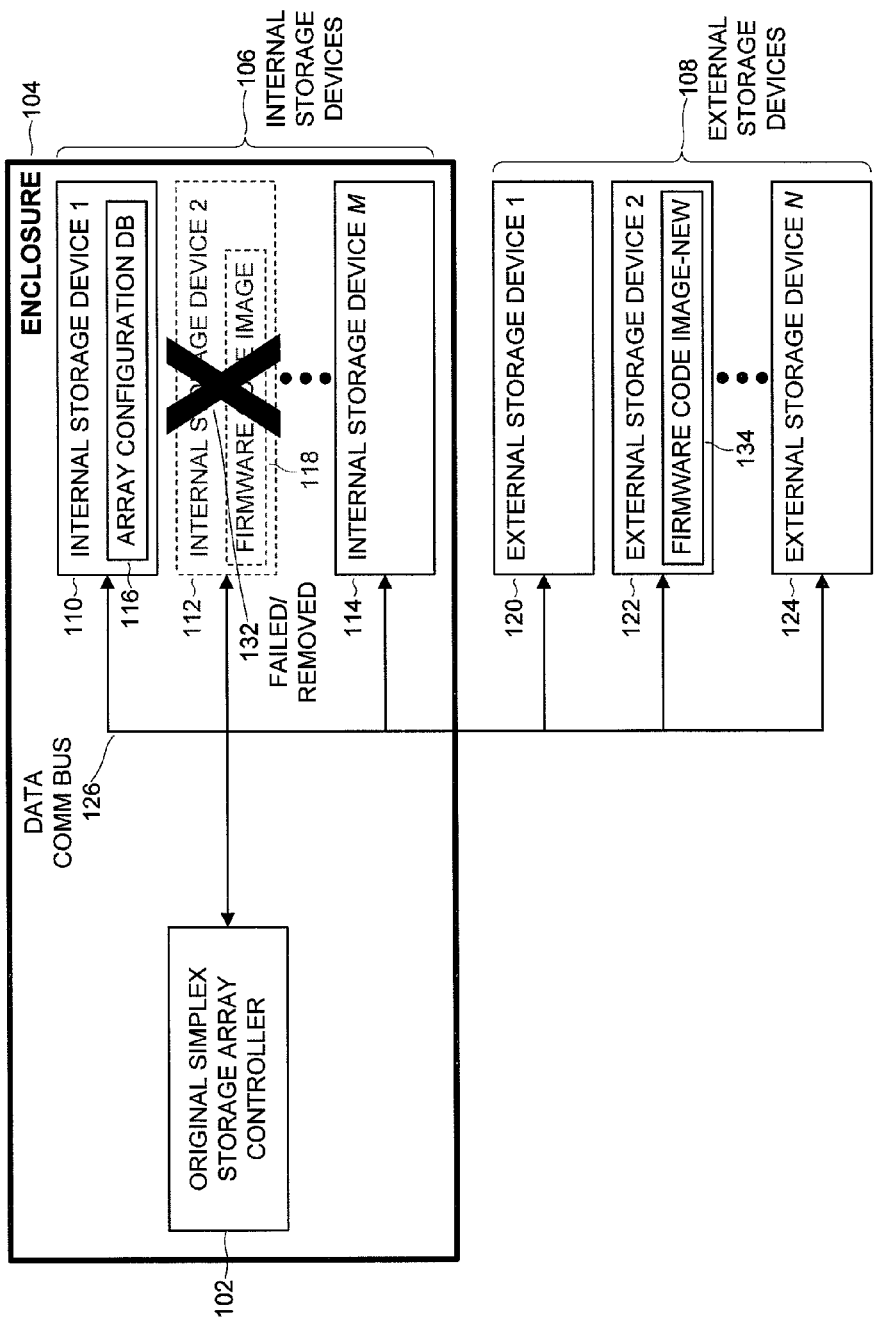
FIG. 1C is a block diagram of the embodiment of the storage array system of FIG. 1A with a failed firmware repository storage device.

In a single array controller (i.e., simplex array controller) storage array system, when the single/simplex controller fails, a user may need to replace the failed controller with a spare replacement controller. Many times the spare replacement controller is a spare replacement controller for many different storage array systems. Thus, the firmware revision running on the spare replacement controller is often different than (i.e., is at a different revision level than) the firmware that was running on the original, failed, controller. For a failure of the simplex array controller in a typical simplex array controller system, in order to return the system to a pre-failure state a user needs to keep track of what revision of firmware is operating on the simplex array controller prior to failure so that the user knows what revision of firmware to load onto the replacement array controller after the original array controller has failed. Tracking the revision of firmware operating on a simplex array controller becomes more problematic when a user has multiple simplex array controller systems and must individually track each system to ensure that the original firmware revision is known and available for loading onto the replacement array controller. One skilled in the art will recognize that there are several means of tracking the original firmware revision numbers, including, but not limited to a basic pen and paper system and/or an electronic spreadsheet. One skilled in the art will further recognize that any system of tracking the original firmware revision numbers is tedious, time consuming, and prone to human error. In addition to tracking the original revision numbers, the actual binary/executable firmware revisions of the original controllers must also be stored, tracked and ready for upload to the replacement controller after a controller has failed. After a failure of an original array controller, a user will need to synchronize the firmware revision running on the replacement controller with the firmware that was running on the original controller prior to failure. Once the user has determined the firmware revision needed and has obtained the proper firmware revision binary/executable file, the replacement controller may be inserted into the simplex controller system. Generally, the system will boot and be placed into a "lock-down" state where the only option is to load the correct firmware revision onto the replacement controller. The user may then load the correct firmware revision of the original controller as determined from the tracking system (e.g., the pen and paper and/or spreadsheet tracking systems) and reboot the system. One skilled in the art will recognize that the typical system for synchronizing the firmware revision of the replacement controller with the original failed controller is cumbersome, tedious, time-consuming, and requires separate storage of all of the firmware revisions running on all of the simplex array controller systems managed by a user. As discussed in more detail below, an embodiment may provide a system that tracks and stores the firmware revision for an array controller in a simplex (i.e., single controller) storage array such that a user simply inserts the replacement controller into a system in place a failed controller and the embodiment automatically synchronizes the firmware revision of the replacement controller with the firmware revision that was running on the original, failed controller.

FIG. 1A is a block diagram 100 of an embodiment of a storage array system with an original simplex storage array controller 102 prior to replacement of the original simplex storage array controller 102. A simplex (i.e., single controller 102) storage array may be comprised of internal storage devices 106 and/or external storage devices 108. In the embodiment shown in FIG. 1, a storage array system is shown with both internal 106 and external 108 storage devices. An internal storage device 106 may be understood as a storage device 106 that is physically contained within the same enclosure 104 as the simplex array storage controller 102. One example may be a computer with both a storage array controller 102 and one or more disk drives (i.e., storage devices 106) contained within the same computer enclosure 104. Other systems may include a peripheral storage device that contains the storage controller 102 in the same enclosure 104 as the one or more storage devices 106, but that is external to the computer system enclosure. An external storage device 108, is a device that is external to the enclosure 104 that contains the storage controller 102. For example, external storage devices 108 may be connected via a standard bus, such as SAS (Serial Attached SCSI (Small Computer System Interface)), Fibre Channel, Universal Serial Bus (USB), and/or other standard bus technologies, to the enclosure 104, and hence to the storage array controller 102. One skilled in the art will understand that other embodiments may have a storage array comprised of only internal storage devices 106, and that still other embodiments may be comprised of only external storage devices 108, while still maintaining the same replacement controller firmware revision synchronizing functionality described herein. One skilled in the art will further recognize that a single physical storage device may be partitioned to appear as multiple "logical" storage devices as well as an entire physical storage device being represented as a single "logical" storage device. For the embodiments described herein, a storage device 106, 108 may be interpreted as describing a "logical" storage device such that, in physical terms, there may be one or more "logical" storage devices configured for each physical storage device. For the embodiments described herein, a storage array may be comprised of a plurality of "logical" storage devices. However, since a single physical storage device may be partitioned into multiple "logical" storage devices, it is feasible that a storage array is comprised of a single physical storage device portioned into a plurality of "logical" storage devices. Physical storage devices may be comprised of any computer readable storage media, including, but not limited to: Hard Disk Drives (HDDs), Solid State Media Disks (SSDs), tape drives, optical drives, etc.

In a simplex storage array system there is a single storage array controller 102 that manages access to and control of the storage devices 106, 108 in the storage array. A typical storage array controller, such as original simplex storage array controller 102, maintains an array configuration database 116 stored off-board of the controller 102 to store controller information and other array configuration data. The array configuration database 116 may also be referred to herein as the configuration database 116 in order to provide brevity in referring to the array configuration database 116. Various embodiments may assume that controller and firmware revision information that identifies the controller 102 and firmware revision of the firmware running on the controller 102 is stored in the array configuration database. Controller identification information may include, but is not limited to: a board identification number that identifies the type/model of the controller, a serial number of the controller, a manufacturer identification of the controller, and/or a model number of the controller. Firmware revision information may include, but is not limited to the firmware revision number of the firmware running on the controller. The configuration database 116 may be stored off-board of the controller 102 on one or more of the storage devices 106, 108 that make up a storage array. In the embodiment shown in FIGS. 1A-C, the configuration database 116 is stored on internal storage device 1 (110). However, a typical system may mirror the configuration database 116 across a plurality of storage devices 106, 108 using standard mirroring techniques for a storage array. The plurality of storage devices included in the mirroring operation may include all of the storage devices 106, 108 of the storage array, or a subset of the storage devices 106, 108 of the storage array.

The embodiment shown in FIGS. 1A-C shows the configuration database being stored on a single storage device, internal storage device 1 (110), in order to show the simplest form of an embodiment so as to avoid the confusion of showing a more complex mirrored implementation of the configuration database 110 storage. For the embodiment shown in FIGS. 1A-C, the configuration database may be stored on any of the storage devices 106, 108 as is determined by the standard controller 102.

In the embodiment shown in FIG. 1A, there is an original simplex storage array controller 102 that acts as the storage controller for the internal storage devices 106 and the external storage devices 108. In some contexts, the "original" controller 102 may be referred to as a "native" controller 102. The internal storage devices 106 are comprised of the plurality of storage devices from internal storage device 1 (110) to internal storage device M 114. The external storage devices 108 are comprised of the plurality of storage devices from external storage device 1 (120) to external storage device N 124. The internal storage devices 106 are contained in the same enclosure with the original storage array controller 102. The array configuration database 116 is stored off-board from the array controller 102 on internal storage device 1 (110). Data delivered to and from the internal 106 and external 108 storage devices, including the configuration database 116 and the firmware code image 118 (see further description below), is communicated over the data communication bus 126. The data communication bus 126 may be any communication bus used for communication between a standard simplex storage array controller 102 and storage devices 106, 108 in a storage array. The various embodiments store the firmware controller image 118 in an off-board storage medium (internal storage device 2 (112) for the embodiment shown in FIG. 1A) for later use in restoring the original firmware revision stored in the firmware code image 118 to a replacement controller (see item 128 in FIG. 1B). As with the configuration database, another embodiment may store the firmware code image in a repository that is mirrored across a plurality of storage devices 106, 108 of a storage array using standard mirroring techniques for the storage array, or otherwise combine a plurality of storage devices 106, 108 to create the firmware repository. Typically, when a plurality of storage devices 106, 108 are combined together to create the firmware repository, a "logical" storage device may be created to abstract the plurality of storage devices to be addressable as a single, firmware repository storage device. An embodiment may also create a separate partition (i.e., a separate logical storage device) dedicated and reserved for holding the firmware code image. Again, the plurality of storage devices included in the mirroring operation may include all of the storage devices 106, 108 of the storage array, or a subset of the storage devices 106, 108 of the storage array. The firmware code image 118 of an embodiment may include a current image of the revision of firmware running on the original controller 102 that is consistent with the information stored in the configuration database 116. The firmware code image 118 for the original controller 102 may then be written to a defined reserved repository on at least one of the storage devices 106, 108 of the storage array controlled by the original array controller 102. An embodiment may also update the configuration database 116 to include an entry that contains the location of the storage repository that contains the consistent firmware code image 118. It is notable that the firmware code image 118 stores the revision of firmware running on the original controller 102 so that it is unnecessary to manually/separately maintain a library of firmware revisions to load onto replacement controllers since the one revision needed for the storage array system is stored off-board of the controller 102 on a storage device (internal storage device 2 (112) for the embodiment shown in FIG. 1A) within the storage array system.

As one skilled in the art will recognize, different storage media devices may have varying degrees of reliability. To account for potential losses of integrity of data stored on computer readable media storage devices, an embodiment may incorporate some form of validity checking to ensure that the firmware code image 118 is valid copy of the originally stored firmware code image 118. While standard validity checks may be used to ensure validity of the firmware code image 118, a double Cyclic Redundancy Check (CRC) algorithm may be beneficially employed by an embodiment to deliver near one hundred percent certainty that the firmware code image has not been corrupted. To implement the double CRC algorithm, an embodiment may calculate and store a CRC value for each sub-section of the firmware code image 118 (e.g., each header and/or each binary/executable code partition of a firmware code image 118) using a first CRC polynomial and then calculate and store a CRC value of the entire firmware code image 118 using a second CRC polynomial. Thus, an embodiment has multiple, separate calculations of a CRC value for the entire firmware code image 118 and for sub-sections of the firmware code image 118 such that all of the CRC values (entire and each sub-section) stored in the firmware code image 118 need to be validated when the firmware code image is read for uploading to a replacement controller (item 128 on FIG. 1B). Further, by using two separate CRC polynomials for the calculations, the likelihood of an error being masked by the CRC checks is doubly removed since the two CRC polynomials arrive at the stored CRC value using different mathematical equations. Accordingly, with the use of the double CRC validation described above, statistically it is nearly impossible for an error to be masked by two CRC checks using two separate CRC polynomials.

Various embodiments may implement the firmware code image 118 in different formats. One skilled in the art will recognize that a firmware code image format that permits the storage of the firmware revision running on the original controller 102 along with sufficient firmware revision information to identify the stored revision of firmware for comparison to the firmware revision running on a replacement controller (item 128 on FIG. 1B) to determine if the firmware revision running on the replacement controller matches the firmware stored in the firmware code image 118. Other information may also be stored in the firmware code image 118, such as identification information of the original controller, storage lengths, binary/executable code location information, and validity check information such as the CRC values described above. One embodiment of the format for a firmware code image 118 is described below in the disclosure with respect to FIG. 2.

As described above, different storage media devices may have varying degrees of reliability. Thus, another means to increase storage reliability for the firmware code image 118, is to select the storage device that will contain the firmware storage repository using Quality of Service (QOS) criteria of the various storage devices 106, 108 of the storage array controlled by the storage array controller 102. For instance, an embodiment may choose to first select storage devices 106 contained in the same enclosure 104 with the controller 102 if the storage devices 106 co-exist in the same enclosure 104 with the controller 102. An embodiment may then select the internal storage devices 106 with the highest Mean Time Between Failure (MTBF) over other internal storage devices 106 with lower MTBFs. An embodiment may also differentiate internal storage devices 106 by selecting non-security capable storage devices and/or by selecting storage devices with smaller capacities. If there are not any internal storage devices 106 in the storage array, an embodiment may apply similar criteria to the external storage devices 108. Further, an embodiment may perform a more extensive analysis with various minimum acceptable values for the MTBF, storage capacity, and security capable parameters of the storage devices such that a selected storage device must meet the minimum acceptable values or the storage controller 102 will not consider the storage devices unless there are no internal 106 or external 108 storage devices that meet the minimum acceptable standard. If there are no storage devices 106, 108 that meet the minimum acceptable values, an embodiment may perform additional algorithms to select the best possible storage device considering the QOS criteria of the available storage devices 106, 108.

Selecting internal storage devices 106 increases potential availability because many times in a failure scenario where a controller 102 is being replaced (item 130 in FIG. 1B), it is possible that external storage devices 108 are disconnected as part of fault-isolation checks by a user. Selecting storage devices 106, 108 with the highest MTBF plainly results in selecting the storage devices 106, 108 with the statistically least likelihood of failing. Avoiding storage devices 106, 108 with security capabilities may simplify the controller replacement process by reducing the likelihood that an encryption key will need to be provided to permit the restoration of the firmware code image 118 to the replacement controller (item 128 of FIG. 1B). Selecting lower capacity storage devices 106, 108 increases the likelihood that the revision of firmware running on the replacement controller (item 128 of FIG. 1B) has support for the storage device (internal storage device 2 (112) in FIG. 1A) holding the firmware code image 118. Typically, as storage device 106, 108 capacities increase, newer revisions of controller firmware are required to support the increased capacities, or at least to provide certification of the controller firmware with the new/larger storage devices. Hence, it is more likely that a replacement controller (item 128 on FIG. 1B) running older firmware will have support for smaller capacity storage devices and will, accordingly, be more likely to read the stored firmware code image 118. While many storage arrays contain the same type of storage devices (currently a storage array is typically made up of hard disk drives), if a storage array has different types of storage devices (e.g., hard disk drives and solid state media drives), the type of storage device may also be factored into the storage device QOS selection criteria. Firmware repository device selection functions may be incorporated into a firmware repository device selection module/sub-system on a storage controller.

An embodiment may determine that a firmware code image 118 needs to be created during controller 102 initialization (i.e., controller 102 boot). An embodiment may also periodically run checks (i.e., monitor), by the controller 102, to determine if a firmware code image 118 needs to be created. A check to determine if a firmware code image 118 needs to be created may include checking to see if the firmware code image 118 exists at the designated firmware repository location. If the firmware code image 118 does not exist, then a firmware code image may be created. If the firmware repository location does not exist or the storage device holding the firmware repository (internal storage device 2 (112) in FIG. 1A) indicates a predictive failure, it may be necessary to select a new firmware repository location as well. The check to determine if a firmware code image 118 needs to be created may also include checking to see if the firmware code image 118 is valid, such as a check of any CRC values stored in the firmware code image 118 by re-performing the CRC calculations and comparing the calculated CRC results to the stored CRC values. If the calculated and stored CRC values do not match, the firmware code image 118 is considered invalid and a new firmware code image 118 may be created. Further, an embodiment may decide to move the firmware repository location because the corruption of the firmware code image 118 may indicate that the storage device holding the firmware (internal storage device 2 (112) in FIG. 1A) is not functioning properly. If a valid firmware code image 118 has been found, the check to determine if a firmware code image 118 needs to be created may further check to see if the firmware on the original controller 102 has been updated. If the firmware on the original controller 102 has been updated, a new firmware code image 118 may be created to reflect the updated firmware revision running on the original controller 102. An update to the firmware revision running on the original controller 102 differs from a replacement controller (item 128 in FIG. 1B) having a different revision of firmware in that if it is determined that the different revision is running on the original controller 102 (i.e., the same controller 102 as the controller 102 that stored the firmware code image 118), it is assumed that the change to the firmware is an intentional act to update the original controller 102 and not part of a replacement process that requires synchronization between the firmware revision running on the original controller 102 and the firmware revision running on the replacement controller (item 128 in FIG. 1B). Monitoring functions may be incorporated into a storage controller in a monitoring module/sub-system on a storage controller.

FIG. 1B is a block diagram 150 of the embodiment of the storage array system of FIG. 1A with the original simplex storage array controller 102 being replaced 130 by a replacement simplex storage array controller 128. In FIG. 1B a replacement controller 128 replaces 130 the original controller 102. While a replacement controller 128 is typically inserted in place of the original controller 102 when the original controller 102 has failed, an embodiment may work in the same fashion for any reason for a replacement 130 of the original controller 102. An embodiment may detect, by the replacement controller 128, that a replacement controller 128 has been inserted in place 130 of the original controller 102. Various embodiments may permit detection of a replacement controller 128 using any detection methodology preferred by a system designer. One embodiment may compare controller identification information such as serial number and board identification number (i.e., board model information) of the last running controller stored in the configuration database 116 with the same controller identification information of the currently running board on controller start up (aka., at controller boot, at controller initialization, at start of day initialization, etc.). If the controller identification information stored in the configuration database 116 does not match the controller identification information of the currently running controller 128, the system has "detected" that a replacement controller 128 has replaced 130 the original controller 102.

Once the replacement controller 128 has detected that it (i.e., the replacement controller 128) is a replacement controller 128, the replacement controller 128 may read revision information of the original controller 102 from the firmware code image 118 stored in the firmware repository on one of the storage devices (in FIG. 1B it is storage device 2 (112)). The replacement controller 128 may then compare the revision information of the firmware currently operating on the replacement controller 128 to the revision information of the firmware stored in the firmware code image 118. If the firmware revision information from the replacement controller 128 matches the revision information stored in the firmware code image 118, then the firmware revision currently running on the replacement controller 128 is the same as the firmware revision of the original storage controller 102 and the system may continue normal operation without any further operations to synchronize the firmware revisions. If the firmware revision information from the replacement controller 128 does not match the revision information stored in the firmware code image 118, then the firmware revision currently running on the replacement controller 128 is different than the firmware revision of the original storage controller 102 and the system needs to synchronize the firmware revision running on the replacement controller 128. In order to synchronize the firmware revision of the replacement controller 128 to the firmware revision of the original controller 102, an embodiment may upload the firmware revision stored in the firmware code image 118 to the replacement controller 128, and then install and activate the uploaded firmware image on the replacement controller 128. It is notable that the firmware revision of the original controller 102 is uploaded and installed on the replacement controller 128 regardless of whether the firmware from the original controller 102 is an up-rev (newer) or down-rev (older) revision than the revision of firmware currently running on the replacement controller 128 since it is more important to bring the system back to the original configuration than to attempt to update the firmware revision running on the simplex controller 102, 128 controlling the storage array system. An embodiment may locate the repository for the firmware code image by reading a "firmware repository location" field stored in the array configuration database 116. Another embodiment may search the storage devices 106, 108 for a stored firmware code image 118, but searching is not as efficient as storing the firmware repository location in the configuration database 116, and may also result in locating remnant old firmware code images 118 from old storage array systems. A typical upload operation may include uploading the firmware image to be loaded from the firmware code image 118 stored on the firmware repository storage device (i.e., internal storage device 2 (112) for the embodiment shown in FIG. 1B) to a Custom FirmWare (CFW) flash memory module on the replacement controller 128, activating the uploaded firmware revision on the replacement controller 128, and rebooting the replacement controller 128 to run the uploaded and activated firmware revision on the replacement controller 128.

Various embodiments may perform additional validation checks of the firmware code image 128 prior to updating the firmware revision running on the replacement controller 128 with a firmware image stored in a firmware code image 118. If an embodiment has implemented some type of validity checking for the firmware code image 118, the firmware code image should be checked for validity (i.e., checked for possible corruption of the firmware code image file) prior to uploading the stored firmware revision from the firmware code image 118 to the replacement controller 128. For example, for the double CRC check type validation described in the disclosure of FIG. 1A above, see the disclosure with respect to FIG. 7 for a description of validating the firmware code image 118. Additionally, to ensure that a system is not a combination of multiple other systems, it may be necessary to compare the controller identification information stored in the configuration database 116 that identifies the last running controller (i.e., the original controller 102) with the controller identification information stored in the firmware code image 118. If the controller identification information from the configuration database 116 does not match the controller identification information stored in the firmware code image 118, then there is an error condition indicating that the firmware code image 118 is not consistent with (i.e., does not match) the identified original controller 102. An embodiment may identify the controller using a controller serial number stored in the configuration database 116 and in the firmware code image 118. While the controller serial number provides the necessary controller identification, any identifying information that permits a functional comparison of the controller information stored in the configuration database 116 and in the firmware code image 118 may be used for comparison. A further detailed description of one embodiment performing operations to update the firmware revision on a replacement controller may be found in the description with respect to FIG. 5.

FIG. 1C is a block diagram 160 of the embodiment of the storage array system of FIG. 1A with a failed 132 firmware repository storage device (internal storage device 2 (112) for the embodiment shown in FIG. 1C). As described in the disclosure with respect to FIG. 1A, an embodiment may periodically check to ensure that the storage device (internal storage device 2 (112) for the embodiment shown in FIG. 1C) exists and is operating properly. The same check as a periodic check may be performed at controller initialization/boot and/or on demand at the request of a user. Further, if a system is able to asynchronously notify the controller 102 of a failure (i.e., the event is pushed to the controller 102 when the event occurs rather than checked on periodically), then a check and/or move of the firmware code image 118 may be triggered by an event indicating failure, removal, or predictive failure of a firmware repository storage device (internal storage device 2 (112) in the embodiment shown in FIG. 1C). This type of "push" event processing may be used for an event relating to any of the checks described below, such as an event related to updating/upgrading the firmware revision running on the storage controller 102, or the addition or subtraction of storage devices 106, 108 available for selection based on QOS criteria.

If, for some reason, the firmware repository storage device (internal storage device 2 (112) for the embodiment shown in FIG. 1C) has failed 132, or is predicted to fail, an embodiment may move the firmware code image 118 from the failed/failing firmware repository storage device (internal storage device 2 (112) for the embodiment shown in FIG. 1C) to a new repository storage device (external storage device 2 (122) for the embodiment shown in FIG. 1C). If the old firmware code image 118 is lost or corrupted due to the failure of the old firmware repository storage device (internal storage device 2 (112) for the embodiment shown in FIG. 1C), a new firmware code image 134 may need to be created. If the old firmware code image 118 is able to be validated and is still available, for instance in the case of a predictive failure, it may be possible to copy the old firmware code image 118 to the new location for the new firmware code image 134. Various embodiments may prefer to always create a new firmware code image 134 rather than copy an old firmware code image 118 in the case of any type of decision to relocate the firmware code image 118, 134. Selection of the new firmware repository storage device (external storage device 2 (122) for the embodiment shown in FIG. 1C) may be random, sequential, or based on QOS criteria (as described above in the description with respect to FIG. 1A). In the embodiment shown in FIG. 1C, the new firmware repository storage device was selected to be external storage device 2 (122). If the embodiment shown in FIG. 1C were a system selecting a new firmware repository location based on QOS criteria, it is likely that any remaining internal storage devices (110 to 114, excluding failed internal storage device 2 (112)) do not meet the minimum acceptable criteria for selection as the firmware repository storage device.

Some embodiments may elect to move the firmware code image 118, 134 for additional reasons other than a failure or predicted failure of the firmware repository storage device (internal storage device 2 (112) for the embodiment shown in FIG. 1C). For instance, if the firmware repository storage device (internal storage device 2 (112) for the embodiment shown in FIG. 1C) is removed from the system, a new firmware code image would need to be created and stored on another storage device (110 to 114 excluding removed 112, and 120 to 124). Embodiments may also continually evaluate the QOS criteria of the storage devices 106, 108 and change the location of the firmware code image 118, 134 if a higher ranking storage device 106, 108 is determined by a check of the QOS criteria. Further, if desired, an embodiment may permit a user to select and/or move the location of the firmware code image 118, 134 on demand of the user. Additional periodic and initialization/boot checks may include checking the validity of the stored firmware code image 118, 134 and/or checking that the firmware revision stored in the firmware code image matches the firmware revision of the original controller 102. The checks on the firmware code image 118 take place prior to any replacement of the storage controller 102). If the firmware is invalid and/or if the firmware revision running on the original controller 102 has changed, then an embodiment may create and store a new firmware code image 118 to reflect the currently running firmware on the original controller 102.

Figure 2:
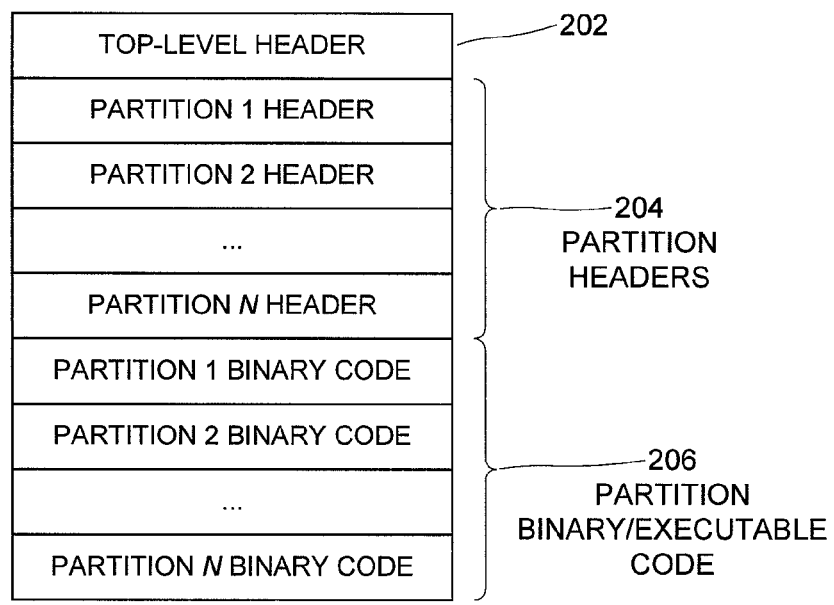
FIG. 2 is a block diagram of a format of a firmware code image for an embodiment.

FIG. 2 is a block diagram of a format of a firmware code image 200 for an embodiment. The firmware code image 200 is written to a firmware repository storage device using the standard read/write access techniques applicable to the type and model of storage device holding the firmware repository (i.e., holding the firmware code image 200). One skilled in the art will recognize that various embodiments may implement the firmware code image using a wide variety of formats as long as the necessary firmware revision information to identify the firmware and the binary/executable code of the firmware revision is stored in the firmware code image. In the embodiment of the firmware code image 200 shown in FIG. 2, the format of the firmware code image 200 has three primary sections, a top-level header 202, partition headers 204, and partition binary/executable code 206. The format of the embodiment of the firmware code image 200 shown in FIG. 2 is designed to: support identification of the stored firmware revision and the platform(s) that the firmware code image contains and/or supports; support validation of the firmware code image for consistency and integrity; and support for one or more (i.e., multiple) variable-length code partitions of the firmware revision being stored in a single firmware code image file 200. Further, the format of the firmware code image 200 shown in FIG. 2 also permits future image content to be added to the end of the image without affecting the organization of the content of the firmware code image 200. Thus, a replacement board may retain the ability to restore firmware code from the firmware control image 200 regardless of whether the replacement controller starts out using either up-rev (i.e., newer revision) or down-rev (older revision) firmware compared to the firmware revision associated with the firmware code image 200.

The top-level header 202 may contain multiple pieces of information that identify the stored firmware revision, and potentially information to identify the format of the firmware code image 200 and/or information to identify the original controller that created and stored the firmware code image 200. One embodiment may include the following information in the top-level header 202:

1) A fixed ASCII (American Standard Code for Information Exchange) header "signature" that may be used for identification of the header type in order for different firmware revisions to adjust value locations as necessary to properly read the firmware code image 200.
2) A 32-bit CRC value that is calculated across the remainder of the top-level header 202 content using a first (sub-section) CRC polynomial.
3) A header version/layout indicator to facilitate future extensions of the top-level header 202 content without a misinterpretation of data by an older (i.e., down-rev) firmware revision. Up-rev and down-rev firmware reading/writing from/to the firmware code image may be able to interpret the older top-level header 202 layouts placed at the beginning of the header up to at least the portion of the top-level header 202 that is/was supported by the currently running firmware revision. Accordingly, in order to maintain down-rev (i.e. older) firmware revision support an embodiment may limit changes to the top-level header 202 layout to only extensions (i.e., adding fields), and existing fields may only be changed in size, not in meaning or content. The limits to the top-level header 202 changes are necessary to be able to restore firmware code images from firmware that is up-rev (newer) and down-rev (older) in relation to the firmware revision stored in the firmware code image.
4) A 32-bit CRC value that is calculated across the entire firmware code image using a second (entire image) CRC polynomial.
5) Firmware revision (aka. version) information used to identify the firmware code revision contained in the firmware code image.
6) A serial number of the storage controller that created and stored the firmware code image.
7) A "valid flag" that is a Boolean indication of whether the firmware code image create and store process completed successfully, and, thus, whether the firmware code image was created and stored as a valid or invalid file.

The "valid flag" in the top-level header 202 may be used by an embodiment to ensure that the create and store process for the firmware code image was not interrupted (i.e., completed in full). To ensure that the create and store process for the firmware code image is not interrupted, an embodiment may first write to the valid flag that the image is invalid. The embodiment may then create and store all of the relevant firmware code image content. Once all of the firmware code image content is created and stored in the firmware code image, as a last step, the create and store firmware code image process may write to the valid flag that the image is valid. Thus, if the create and store process is interrupted, the valid flag will indicate that the firmware is invalid. One skilled in the art will recognize that it is necessary to exclude the valid flag from the CRC calculations for the entire image and the top-level header since the last step in the create and store process will change the value stored in the valid flag. A designer for some embodiments may choose to make the CRC calculations the last step in the create and store process, in which case the valid flag will not indicate if there was an interruption prior to calculating any CRC values performed after setting the valid flag to valid. There is some validity checking conflict between which is performed last, the CRC calculation that is used to validate content of the firmware code image from future data corruption and the valid flag used to ensure the firmware code image was created without interruption.

To further optimize performance, as well as to ensure that the firmware code image creation and store process was not interrupted, an embodiment may limit the length of the top-level header 202 such that the entire top-level header may be written in one atomic write operation (i.e., a single communication message, not several messages split up in order to send data that may exceed packet or frame data limits on the communication channel between the controller and the storage devices). Limiting the top-level header 202 length to ensure writing in one atomic write operation ensures consistency of the top-level header information 202 even if the write process is interrupted.

To facilitate quickly reading the header information for the binary/executable code, an embodiment may place all of the partition headers 204 together so the partition header information 204 of all binary/executable code partitions 206 may be read consecutively without having to skip over binary/ executable code partitions 206 to get to the next partition header 204. Other embodiments may place the partition header 204 next to the associated binary/executable code partition 206, or otherwise arrange the data within the firmware code image. The partition headers 204 may contain multiple pieces of information that identify and/or are associated with a particular partition of binary/executable code 206 of the firmware revision being stored. One embodiment may include the following information in each partition header 204:

1) A CRC value that is calculated across the remainder of the partition header 204 content using the first (sub-section) CRC polynomial.
2) A partition binary/executable code length.
3) Binary/executable code partition (re)location information (if necessary) to allow the restore operation to put the binary/executable code in the proper location in the controller code flash memory.
4) A CRC value that is calculated across the binary/executable code partition 206 associated with the partition header 204 using the first (sub-section) CRC polynomial.

As noted in the disclosure with respect to FIG. 1A above, using a different CRC polynomial to calculate the entire firmware code image CRC value versus the CRC polynomial used to calculate the CRC value for the individual sub-sections (i.e., top-level 202 and partition 204 headers, and the binary/executable code partitions 206) reduces the statistical likelihood that an error in the firmware code image may be masked in the CRC calculations to a near impossibility.

For an embodiment implementing the firmware code image 200 shown in FIG. 2, a read operation of the firmware code image may start with a read of the top-level header 202. The valid flag may be checked to ensure that the firmware code image creation and store process was completed and the valid flag indicates that the firmware code image is valid. If the valid flag indicates the firmware code image is invalid, then the read operation may report that an error condition was encountered. The entire firmware code image may then be verified against the stored CRC value for the entire image using the second (entire image) CRC polynomial. If the calculated CRC value for entire image does not match the stored CRC value for the entire image, the read operation may report that an error condition was encountered. The CRC values for each of the sub-sections (e.g., the top-level header 202, the partition headers 204, and the binary/executable code partitions 206) may then be calculated using the first (sub-section) CRC polynomial and compared to the associated CRC values stored in the firmware code image. If one or more of the calculated sub-section CRC values does not match the associated CRC values stored in the firmware code image, then the read operation may report that an error condition was encountered. If no error conditions were encountered in the validity/complete check, then the firmware code image may be considered valid and read for the data content contained in the firmware code image. If there was an error condition encountered during the validity/complete check, the system may "lock-out" the controller and require operator intervention to attempt to correct or override the error condition.

Figure 3:
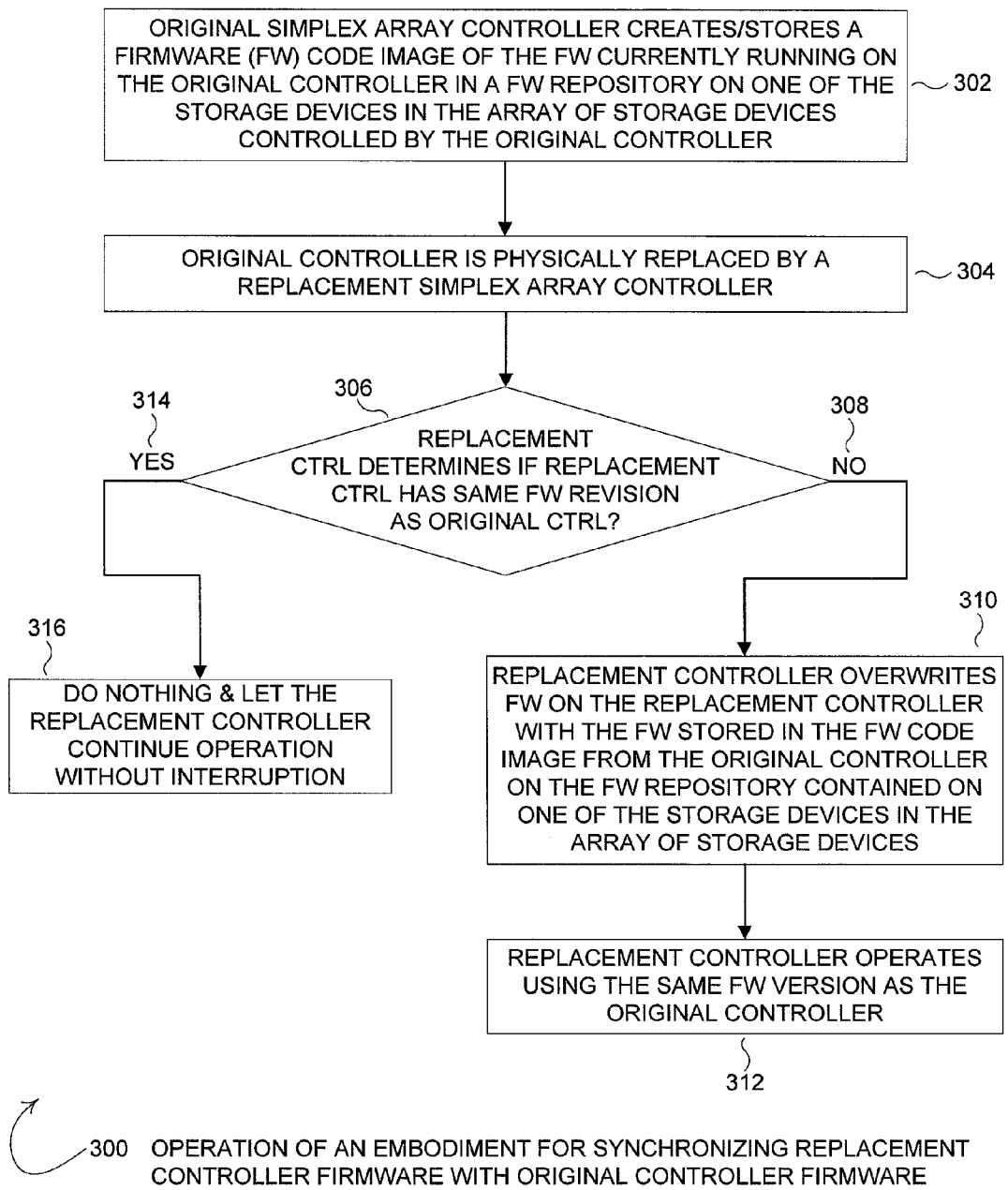
FIG. 3 is a flow chart of the operation of an embodiment for synchronizing the firmware of a replacement controller with the firmware on the original controller being replaced.

FIG. 3 is a flow chart 300 of the basic operation of an embodiment for synchronizing the firmware of a replacement controller with the firmware on the original controller being replaced. At step 302, an original (aka. native) simplex array controller may create and store a FirmWare (FW) code image of the firmware revision currently running on the original simplex array controller in a firmware repository contained on one of the storage devices that make up the array of storage devices controlled by the original controller. The creation and storage of the firmware code image in step 302 may be incorporated into a firmware code image creation and storage module/sub-system operating on a storage controller. At step 304, the original controller is physically replaced by a replacement simplex array controller. Once the operating storage controller has detected that the operating storage controller is a replacement controller that has been inserted in place of the original controller, at step 306, an embodiment operating as the replacement controller may determine if the replacement controller is running the same revision of firmware as is stored in the firmware code image created and stored by the original controller. If the replacement controller is not running the same revision of firmware as is stored in the firmware code image created by the original controller 308, the embodiment may then proceed to step 310. At step 310, an embodiment operating as the replacement controller may overwrite (i.e., upload, install and activate) the firmware revision running on the replacement controller with the firmware revision stored in the firmware code image created by the original controller. The replacement of the firmware revision running on the replacement controller is done irrespective of whether the firmware running on the controller is a newer revision (i.e., up-rev) of the firmware revision stored in the firmware code image since the goal of the synchronization is to place the storage array system into the same configuration as was operating with the original/replaced controller. The determination that the firmware revision running on the replacement controller of step 306 and the overwriting/updating of the firmware on the replacement controller of step 310 may be incorporated into a synchronize and update firmware module/sub-system operating on a storage controller. At step 312, an embodiment operating as the replacement controller may operate normally using the same firmware revision as the original controller, and, with regard to potential future replacements of the storage controller, the replacement controller may effectively become the original/native controller. If, at step 306, the replacement controller is running the same revision of firmware as is stored in the firmware code image created by the original controller 314, then an embodiment may proceed to step 316. At step 316, an embodiment operating as the replacement controller firmware does not need to be changed, so an embodiment may do nothing with regard to changing the firmware running on the replacement controller and the replacement controller may proceed to normal operation without further interruption.

It is worth noting that the firmware running on a storage controller generally has the capability of performing the operations of both the original storage controller and the replacement controller. Thus, a controller may be capable of creating and storing a firmware code image of the currently running firmware version when the controller has determined that the controller is operating as the original/native array controller. When the controller has determined that the controller is operating as a replacement controller, the controller may upload the firmware revision stored in the firmware code image created by another, original, controller and install the firmware revision stored in the firmware code image on itself (i.e., on the replacement controller).

Figure 4:
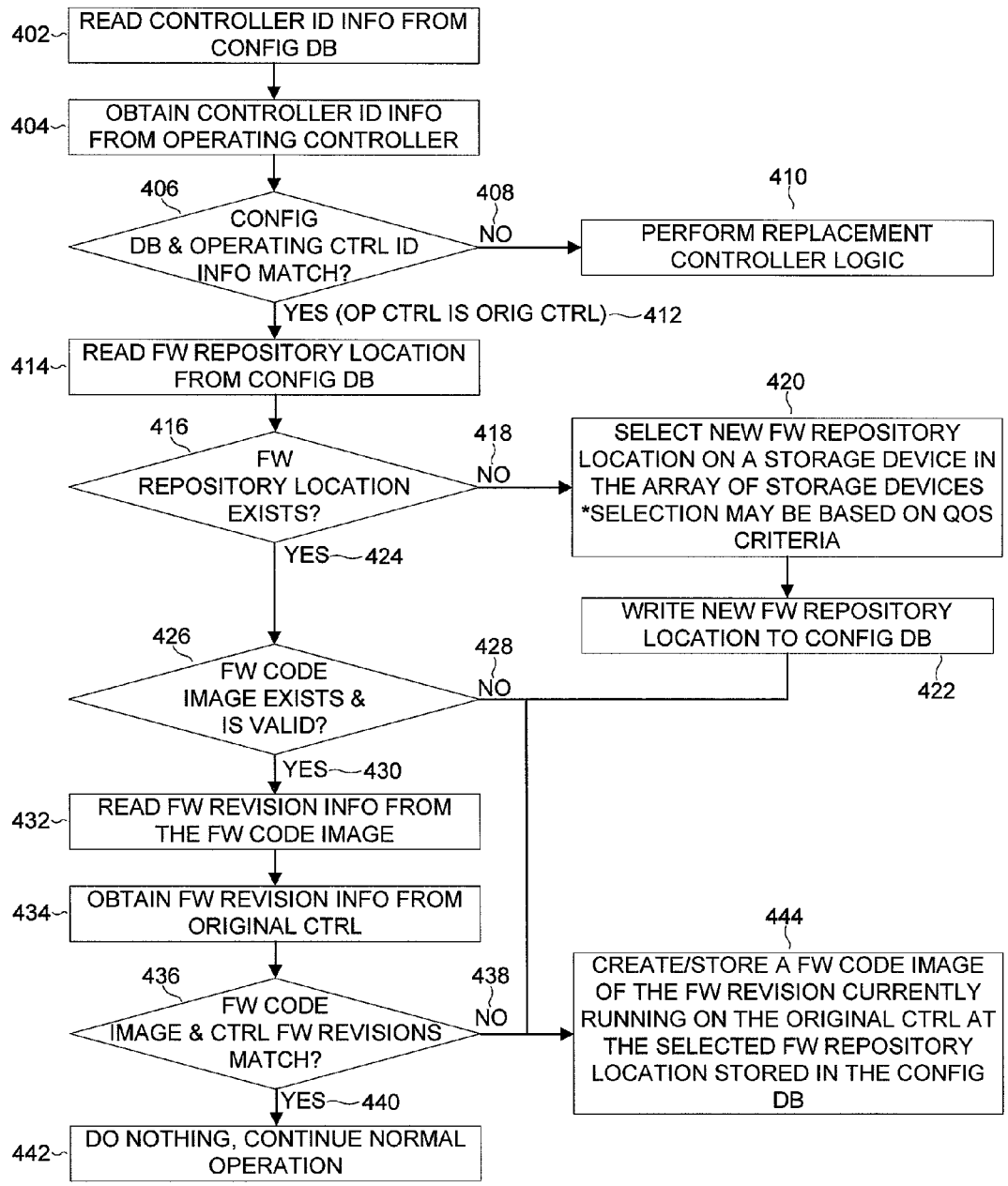
FIG. 4 is a flow chart of operation of an embodiment for creating and storing a firmware code image of the firmware running on an array controller on a firmware repository storage device.

FIG. 4 is a flow chart 400 of operation of an embodiment for creating and storing a firmware code image of the firmware running on an array controller on a firmware repository storage device. At step 402, an embodiment may read controller identification information from the array configuration database. Controller identification information may be any information that alone, or in combination, may be used to particularly identify a particular controller from a plurality of controllers. Examples of controller identification information may include, but is not limited to: a board identification code, a controller serial number, a controller manufacturer identification code, a controller model code, a firmware revision number, and other like information. At step 404, an embodiment may obtain controller identification information from the operating controller. At step 406, the controller identification information read from the configuration database is compared to the controller identification information obtained from the currently operating controller to determine if the configuration database and operating controller identification information match. If the controller identification information from the configuration database and the operating controller do not match 408, the system may proceed to step 410. At step 410, the embodiment of the operating storage controller has determined that the operating controller is a replacement controller and will perform the necessary logic to synchronize the firmware of the replacement controller to the firmware created and stored by a previously running "original" controller. Steps 402-406 necessarily need to be performed prior to the configuration database being updated with the controller identification information of the currently operating controller. Thus, steps 402-406 are typically performed at controller initialization/boot-up prior to any updates to the configuration database to reflect information of the currently operating controller. Further, steps 402-406 may be incorporated into a replacement controller detection module/sub-system operating on a storage controller. If, at step 406, the controller identification information from the configuration database and the operating controller match 412, it is determined that the operating controller is the same controller as the last recorded operating controller for the storage array system 412 (i.e., the original controller), and the system may proceed to step 414 to determine if a firmware code image needs to be created to store the firmware revision currently running on the operating/original controller. The remaining steps 414-444 may be incorporated into a firmware code image creation and storage module/sub-system operating on a storage controller. Further, in addition to performing steps 414-444 at controller initialization/boot-up, an embodiment may also periodically perform steps 414-444 at runtime to continually ensure that an up-to-date firmware code image is properly stored for the operating/original controller.

At step 414, an embodiment may read the firmware repository location from the configuration database. At step 416, an embodiment may determine if the firmware repository location exists. If the firmware repository location does not exist 418, such as if the firmware repository storage device has failed or been removed, the embodiment may proceed to step 420. At step 420, an embodiment may select a new firmware repository location on a storage device within the array of storage devices controlled by the controller. As discussed in more detail in the disclosure with respect to FIG. 1A above, QOS criteria of the storage devices in the array of storage devices may be utilized to intelligently select the most reliable storage device for holding the firmware code image of the operating/original controller. At step 422, an embodiment may write the newly selected firmware repository location to the configuration database. Step 422 may then proceed directly to step 444 where an embodiment may create and store a firmware code image of the firmware revision currently running on the operating/original controller at the selected firmware repository location stored in the configuration database. If, at step 416, the firmware repository location does exist 424, the embodiment may proceed to step 426. At step 426, an embodiment may determine if a firmware code image exists at the firmware repository location and if the existing firmware code image is a valid firmware code image. See the disclosure with respect to FIG. 7 below for more detail on validating a firmware code image as may be done for an embodiment using a firmware code image format similar to the format disclosed above with respect to FIG. 2. If the firmware code image does not exist or is invalid 428, the embodiment may proceed directly to step 444 to create and store a new firmware code image at the selected firmware repository location defined in the configuration database. If, at step 426, the firmware code image exists and is valid 430, the embodiment may proceed to step 432. At step 432, an embodiment may read firmware revision information of the firmware stored in the firmware code image from the validated firmware code image. At step 434, an embodiment may obtain firmware revision information for the firmware revision currently running on the operating/original controller from the operating/original controller. At step 436, an embodiment may determine if the firmware revision information for the currently operating/original controller matches the firmware information of the firmware revision stored in the firmware code image. If the firmware revision information of the currently operating/original controller matches the firmware revision information of the firmware stored in the firmware code image 440, the firmware code image is up-to-date and the embodiment may proceed to step 442 where nothing is done to update the firmware code image and the embodiment proceeds with normal controller operation. If the firmware revision information of the currently operating/original controller does not match the firmware revision information of the firmware stored in the firmware code image 438, then the embodiment may proceed to step 444. At step 444, the embodiment may update the firmware code image to store the firmware revision of the currently operating/original controller in a firmware code image located at the selected firmware repository location as stored in the configuration database. The situation of having a mismatch between the firmware revision currently operating on the original controller and the firmware revision stored in a validated firmware code image 438 may be encountered when a user intentionally changes/updates the firmware revision running on the original controller (normally to up-rev the firmware, but also to possibly down-rev the firmware if a newer firmware revision is not operating correctly).

Figure 5:
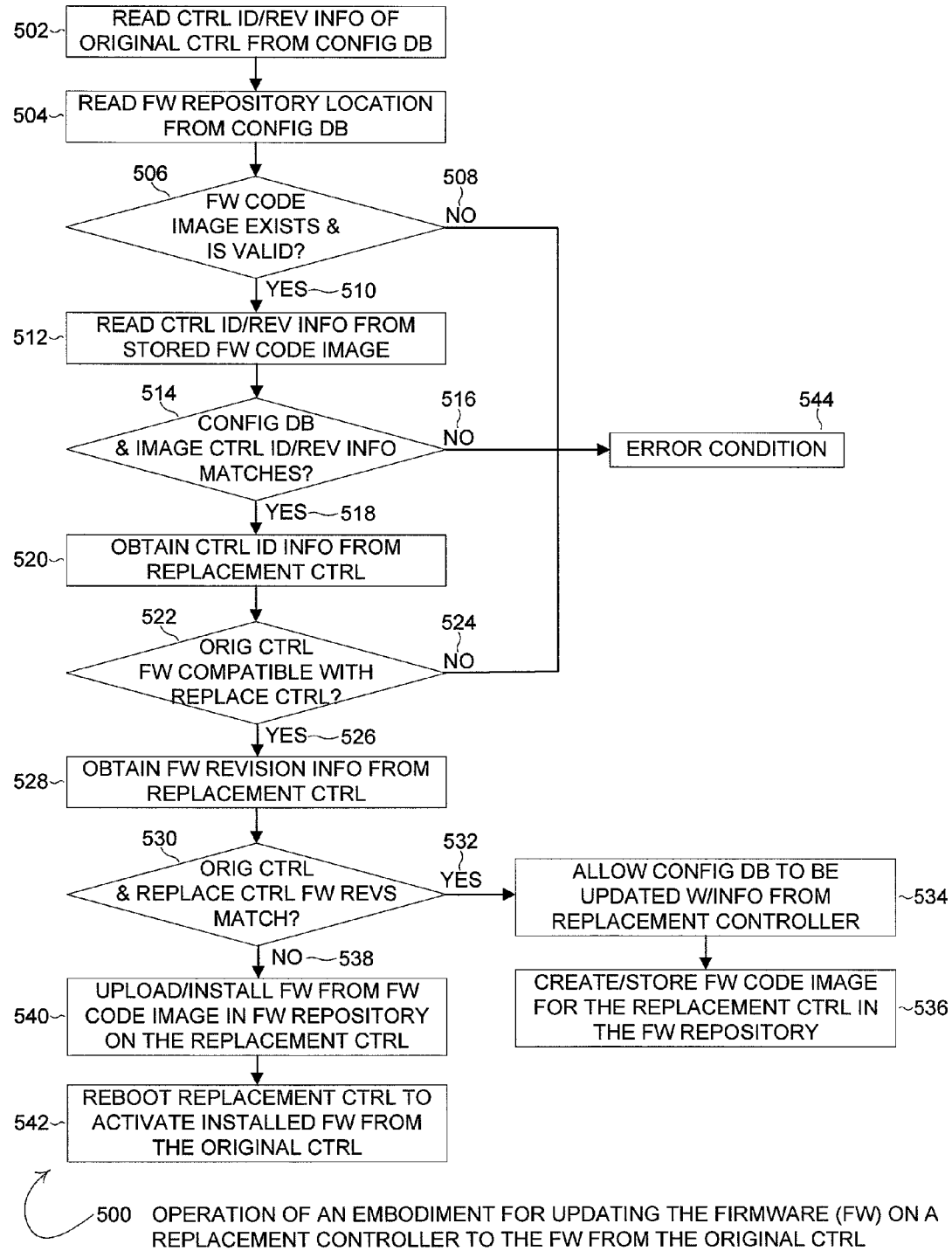
FIG. 5 is a flow chart of operation of an embodiment for updating (i.e., replacing, overwriting, etc.) the firmware on a replacement array controller with the revision of firmware from the original array controller being replaced stored in a firmware code image.

FIG. 5 is a flow chart 500 of operation of an embodiment for updating (i.e., replacing, overwriting, etc.) the firmware on a replacement array controller with the revision of firmware from the original array controller being replaced stored in a firmware code image. The firmware synchronization and updating steps for an embodiment as described in the disclosure with respect to FIG. 5 below may be incorporated into a synchronize and update firmware module/sub-system operating on a storage controller. Also, the firmware synchronization and updating steps for an embodiment as described in the disclosure with respect to FIG. 5 below are not performed by a storage controller until it is determined that the storage controller is a replacement controller replacing an original/native controller.

At step 502, an embodiment may read controller identification and firmware revision information of the original controller from the array configuration database. Step 502 necessarily needs to be performed prior to the configuration database being updated with the controller identification information of the currently operating controller such that the controller identification and firmware revision information stored in the configuration database reflects the last controller controlling the storage array and not the currently operating controller. Thus, step 502 is typically performed at controller initialization/boot-up prior to any updates to the configuration database to reflect information of the currently operating controller. Further, step 502 is merely an information gathering process that may be performed in other processes, such as the process to determine that the operating controller is a replacement controller, so it would not be necessary to re-read the controller identification and firmware revision information if the information has already been read from the configuration database in an earlier completed process.

At step 504, an embodiment may read the firmware repository location from the configuration database. At step 506, an embodiment may determine if a firmware code image exists at the firmware repository location and if the existing firmware code image is a valid firmware code image. See the disclosure with respect to FIG. 7 below for more detail on validating a firmware code image as may be done for an embodiment using a firmware code image format similar to the format disclosed above with respect to FIG. 2. If the firmware code image does not exist or is invalid 508, the embodiment may proceed directly to step 544 and report an error condition. If, at step 506, the firmware code image exists and is valid 510, the embodiment may proceed to step 512. At step 512, an embodiment may read the controller identification and firmware revision information stored in the firmware code image. At step 514, an embodiment may determine if the controller identification and firmware revision information read from the configuration database and read from the firmware code image match. If the controller identification and firmware revision information from the configuration database and from the firmware code image do not match 516, the embodiment may proceed directly to step 544 and report an error condition. If, at step 514, the controller identification and firmware revision information from the configuration database and from the firmware code image match 518, the embodiment may proceed to step 520. One skilled in the art may note that determination step 514 to determine if the configuration database and firmware code image controller identification and firmware revision information match is a check to ensure that the last operating controller (i.e., the original controller) is the controller running the firmware revision that actually created and stored the firmware code image in case storage devices in the storage array may have been taken from a storage array other than the storage array previously controlled by the original controller.

At step 520, an embodiment may obtain the controller identification information from the currently operating replacement controller. At step 522, an embodiment may, based on a comparison of the controller identification information of the original controller as stored in the firmware code image and the controller identification information of the replacement controller obtained from the currently operating replacement controller, determine if the original controller firmware will be compatible with the currently operating replacement controller. The original controller firmware may not be compatible with the currently operating replacement controller if the original controller board identification, manufacturer identification, and/or model identification do not match with the board identification, manufacturer identification, and/or model identification obtained from the currently operating replacement controller. In short, the original controller and the replacement controller may be different models of storage controllers that may not be able to run the same firmware. If, at step 522, an embodiment determines that the original controller firmware is not compatible with the currently operating replacement controller 524, the embodiment may proceed directly to step 544 and report an error condition. If, at step 522, an embodiment determines that the original controller firmware is compatible with the currently operating replacement controller 526, the embodiment may proceed to step 528. At step 528, an embodiment may obtain firmware revision information from the currently operating replacement controller. At step 530, an embodiment may determine if the firmware revision information read from the firmware code image of the original controller matches the firmware revision information obtained from the currently operating replacement controller. If the firmware revision information from the firmware code image of the original controller matches the firmware revision information obtained from the currently operating replacement controller 532, the embodiment may proceed to step 534. At step 534, the currently operating replacement controller may now be considered to be the original/native controller controlling the storage array and an embodiment may allow normal updates to identify the replacement controller in the array configuration database as the last operating controller for the storage array. At step 536, an embodiment may create and store a firmware code image for the replacement controller (now acting as the original/native controller) in the firmware repository. If, at step 530, the firmware revision information from the firmware code image of the original controller does not match the firmware revision information obtained from the currently operating replacement controller 538, the embodiment may proceed to step 540. At step 540, an embodiment may upload and install the original controller firmware revision from the firmware code image created by the original controller on the currently operating replacement controller. At step 542, an embodiment may reboot the currently operating replacement controller in order to activate and run the newly installed original controller firmware. Since the reboot process at step 542 is done automatically without user intervention and is typically done during controller initialization/boot-up, the reboot may not be noticeable to a user since it is simply part of the already occurring controller boot sequence. Thus, to a user, the process may appear to occur in a single controller initialization/boot-up operation such that there is not a separate reboot operation necessary from the user perspective.

Figure 6:
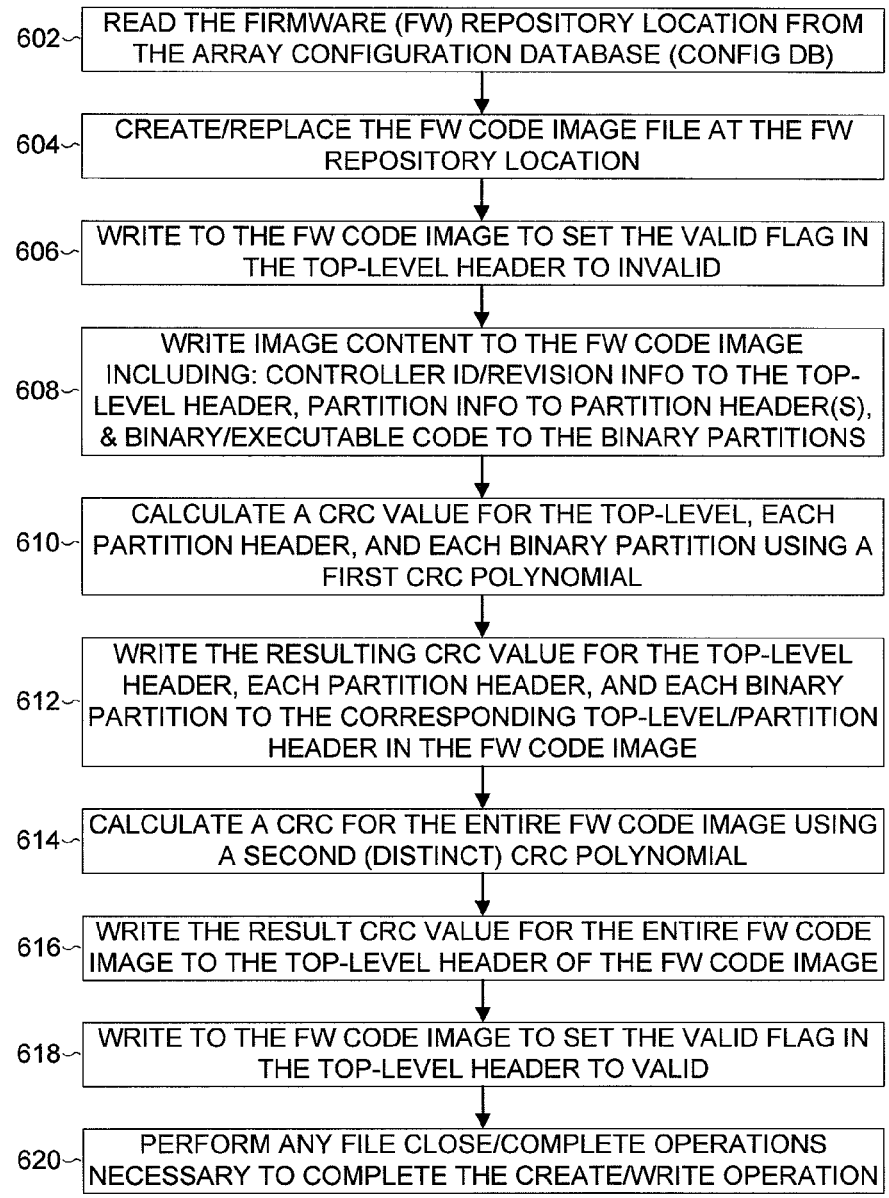
FIG. 6 is a flow chart of operation of an embodiment for creating and storing a firmware code image, including calculations for double Cyclic Redundancy Check (CRC) validation of the stored firmware code image.

FIG. 6 is a flow chart of operation of an embodiment for creating and storing a firmware code image, including calculations for double CRC validation of the stored firmware code image. The firmware code image creation and storage steps for an embodiment as described in the disclosure with respect to FIG. 6 below presume that the format of a firmware code image is similar to the firmware code image described in the disclosure with respect to FIG. 2 above in that the firmware code image has a top-level header, partition headers, and partition binary/executable code sub-sections. Further, the firmware code image creation and storage steps for an embodiment as described in the disclosure with respect to FIG. 6 below may be incorporated into a firmware code image creation and storage module/sub-system operating on a storage controller. The firmware code image creation and storage steps disclosed with respect to FIG. 6 may be initiated programmatically from another module/sub-system and/or may be initiated on demand by a user if desired.

At step 602, an embodiment may read the firmware repository location from the configuration database. At step 604, an embodiment may create or replace the firmware code image file at the repository location. At step 606, an embodiment may write to the firmware code image to set the "valid flag" in the top-level header to invalid. At step 608, an embodiment may write image content to the firmware code image. Image content may include, but is not limited to: controller identification information and/or firmware revision information to the top-level header, partition information to the partition headers, and binary/executable code information to the binary/executable partitions. At step 610, an embodiment may calculate a CRC value for the top-level header, each partition header, and each binary/executable code partition using a first (sub-section) CRC polynomial. At step 612, an embodiment may write the resulting CRC values to the header (i.e., top-level header or one of the partition headers) corresponding to the CRC value. At step 614, an embodiment may calculate a CRC value for the entire code image using a second, distinct, and separate (entire image) CRC polynomial. At step 616, an embodiment may write the resulting CRC value for the entire firmware code image to the top-level header of the firmware code image. At step 618, an embodiment may write to the valid flag in the top-level header of the firmware code image to set the valid flag to indicate valid as the last step in writing information to the firmware code image. At step 620, an embodiment may perform any necessary file close/complete operations to complete/finish the create/write firmware code image operation.

Figure 7:
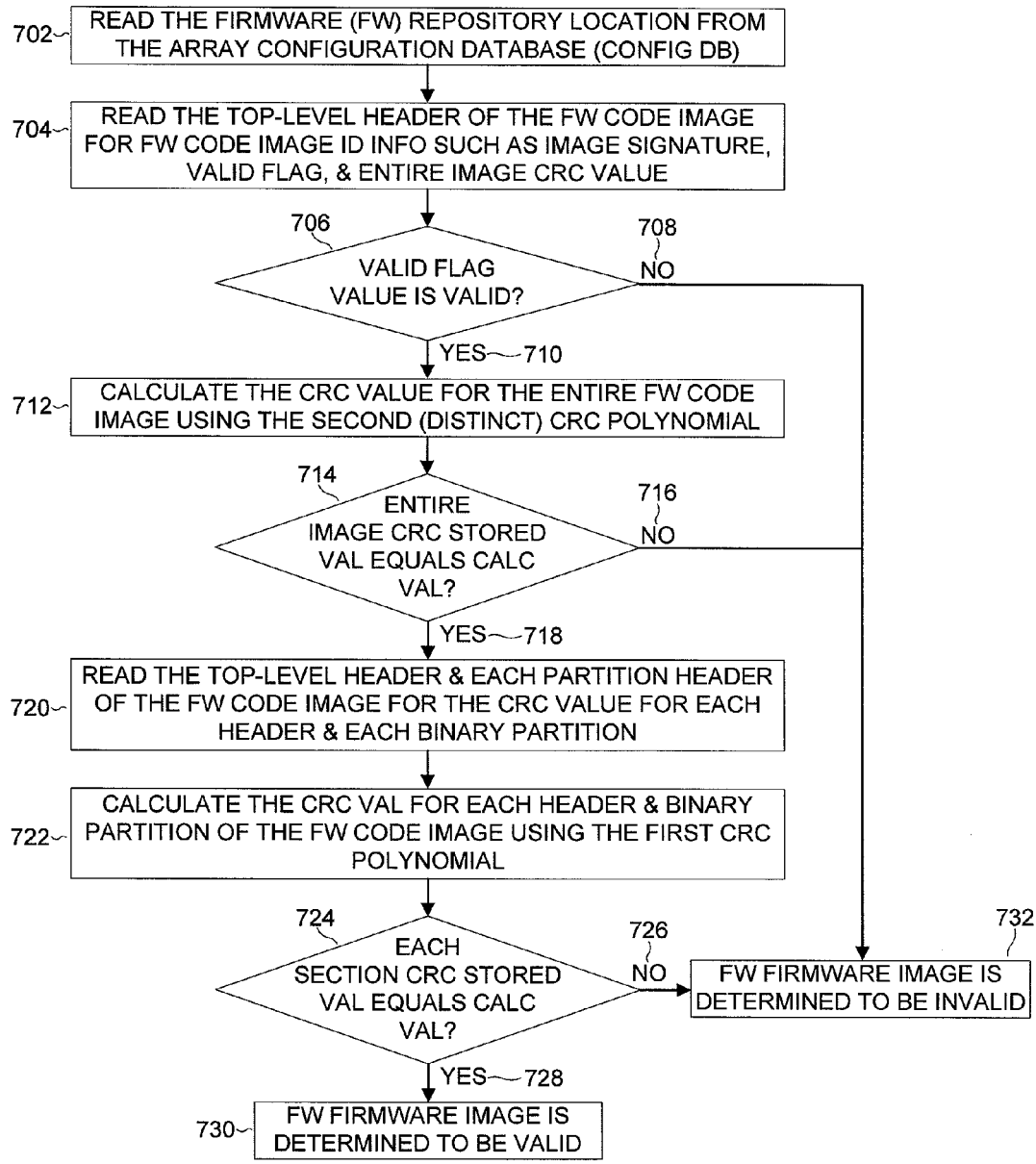
FIG. 7 is a flow chart of operation of an embodiment for validating a firmware code image, including evaluation of double CRC validation of the stored firmware code image.

FIG. 7 is a flow chart of operation of an embodiment for validating a firmware code image, including evaluation of double CRC validation of the stored firmware code image. The firmware code image validation steps for an embodiment as described in the disclosure with respect to FIG. 7 below presume that the format of a firmware code image is similar to the firmware code image described in the disclosure with respect to FIG. 2 above in that the firmware code image has a top-level header, partition headers, and partition binary/executable code sub-sections. Further, the firmware code image validation steps for an embodiment as described in the disclosure with respect to FIG. 7 below may be incorporated into a firmware code image validation module/sub-system operating on a storage controller. The firmware code image validation steps disclosed with respect to FIG. 7 may be initiated programmatically from another module/sub-system and/or may be initiated on demand by a user if desired.

At step 702, an embodiment may read the firmware repository location from the configuration database. At step 704, an embodiment may read the top-level header of the firmware code image for firmware code image identification information. The firmware code image identification information may include, but is not limited to: an image "signature" code, a valid flag, and/or an entire image CRC value. At step 706, an embodiment may determine if the valid flag of the stored firmware code image indicates valid. If the valid flag indicates invalid 708, the embodiment may proceed directly to step 732 and report that the firmware code image is determined to be invalid. If, at step 706, the valid flag indicates valid 710, the embodiment may proceed to step 712. At step 712, an embodiment may calculate the CRC value for the entire stored firmware code image using a second, distinct, and separate (entire image) CRC polynomial. At step 714, an embodiment may determine if the calculated entire image CRC value equals the stored entire image CRC value from the stored firmware code image. If the calculated and stored entire image CRC values are not equal 716, the embodiment may proceed directly to step 732 and report that the firmware code image is determined to be invalid. If, at step 714, the calculated and stored entire image CRC values are equal 718, the embodiment may proceed to step 720. At step 720, an embodiment may read the top-level header and each partition header of the stored firmware code image for the sub-section CRC value for each header (both top-level and partition) and each binary/executable partition. At step 722, an embodiment may calculate the sub-section CRC value for each header (both top-level and partition) and each binary/executable partition using a first (sub-section) CRC polynomial. At step 724, an embodiment may determine if the calculated sub-section CRC values equals the stored sub-section CRC values from the stored firmware code image. If the calculated and stored sub-section CRC values are not equal 726, the embodiment may proceed directly to step 732 and report that the firmware code image is determined to be invalid. If, at step 724, the calculated and stored sub-section CRC values are equal 728, the embodiment may proceed to step 730. At step 730, an embodiment may report that the firmware code image is determined to be valid.

In the above disclosure, one skilled in the art will recognize that certain data gathering and validation steps may be performed in a different order without affecting the final results of an embodiment. It is only necessary that data be gathered prior to being used and that validation steps be performed as necessary to make a determination that a firmware code image is valid. Further, one skilled in the art will also recognize that certain data gathering and validation steps may be performed in multiple modules/sub-systems, and if the data gathering or validation steps were performed by a preceding module/sub-system, it may not be necessary to re-perform the data gathering and/or validation steps.

Various embodiments may provide the control and management functions detailed herein via an application operating on an array storage controller, or may be implemented on a computer system (or other electronic devices). Embodiments may be provided as a computer program product which may include a computer-readable, or machine-readable, medium having stored thereon instructions which may be used to program/operate a computer (or other electronic devices) or computer system to perform a process or processes in accordance with the present invention. The computer-readable medium may include, but is not limited to, hard disk drives, floppy diskettes, optical disks, Compact Disc Read-Only Memories (CD-ROMs), Digital Versatile Disc ROMS (DVD-ROMs), Universal Serial Bus (USB) memory sticks, magneto-optical disks, ROMs, random access memories (RAMs), Erasable Programmable ROMs (EPROMs), Electrically Erasable Programmable ROMs (EEPROMs), magnetic optical cards, flash memory, or other types of media/machine-readable medium suitable for storing electronic instructions. The computer program instructions may reside and operate on a single/simplex array storage controller, a single computer/electronic device or various portions may be spread over multiple computers/devices that comprise a simplex array controller/computer system. Moreover, embodiments may also be downloaded as a computer program product, wherein the program may be transferred from a remote computer to a requesting computer by way of data signals embodied in a carrier wave or other propagation medium via a communication link (e.g., a modem or network connection, including both wired/cabled and wireless connections).

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method to synchronize firmware of a replacement simplex array controller with firmware of an original simplex array controller comprising:
   creating and storing by said original simplex array controller on a firmware repository storage device an original controller firmware code image that contains an original controller revision of firmware that is running on said original simplex array controller and original controller firmware revision information about said original controller revision of firmware, said firmware repository storage device being comprised of at least one storage device of an array of storage devices controlled by said original simplex array controller;
   replacing said original simplex array controller with said replacement simplex array controller;
   determining by said replacement simplex array controller that said replacement simplex array controller is running different firmware than said original simplex array controller was running by comparing replacement controller firmware revision information of firmware currently running on said replacement simplex array controller with said original controller firmware revision information stored in said original controller firmware code image; and
   replacing said currently running revision of firmware on said replacement simplex array controller with said original controller revision of firmware stored in said original controller firmware code image.

2. The method of claim 1 further comprising selecting said at least one storage device comprising said firmware repository storage device from said array of storage devices controlled by said original simplex array controller based on Quality of Service (QOS) criteria of each storage controller of said array of storage controllers.

3. The method of claim 1 further comprising:
   reading, by a currently operating simplex array controller, configuration database controller identification information from an array configuration database associated with said array of storage devices by a currently operating simplex array controller;
   obtaining currently operating controller identification information from currently operating storage controller by said currently operating simplex array controller;
   comparing said configuration database controller identification information with said currently operating controller identification information by said currently operating simplex array controller;
   determining by said currently operating simplex array controller that if said configuration database controller identification information does not match said currently operating controller identification information that said currently operating controller is said replacement simplex array controller and proceeding to said step of determining that said replacement array controller is running a different revision of firmware than said original simplex array controller was running; and
   determining by said currently operating simplex array controller that if said configuration database controller identification information does match said currently operating controller identification information that said currently operating controller is said original simplex array controller, and proceeding to said step of creating and storing said original controller firmware code image that contains said original controller revision of firmware that is running on said original simplex array controller and original controller revision information about said original controller revision of firmware.

4. The method of claim 1:
   wherein said step of determining that said replacement simplex array controller is running a different version of firmware than said original simplex array controller was running further comprises:
      reading said original controller firmware revision information from said original controller firmware code image by said original simplex array controller;
      obtaining said replacement controller firmware revision information from said currently running replacement simplex array controller by said original simplex array controller;
      comparing said original controller firmware revision information to said replacement controller firmware revision information by said original simplex array controller; and
      determining by said original simplex array controller that said replacement simplex array controller is running different firmware than said original simplex array controller if said original controller firmware revision information does not match said replacement controller firmware revision information; and
   wherein said step of replacing said currently running revision of firmware on said replacement simplex array controller with said original controller revision of firmware stored in said original controller firmware code image further comprises:
      uploading said original controller revision of firmware from said original controller firmware code image by said replacement simplex array controller;
      installing said original controller revision of firmware on said replacement simplex array controller by said replacement simplex array controller; and
      rebooting said replacement simplex array controller by said replacement simplex array controller in order to activate and run said uploaded and installed original controller revision of firmware on said replacement simplex array controller.

5. The method of claim 4 wherein prior to reading from and uploading from said original controller firmware code image said original simplex array controller and said replacement simplex array controller validate said original controller firmware code image, said step of validating said original controller firmware code image further comprises:
- reading, by a currently operating simplex array controller, a valid flag from said original controller firmware code image;
- determining, by said currently operating simplex array controller, that said original controller firmware code image is invalid if said valid flag is invalid;
- reading, by said original simplex array controller, a stored entire image CRC value for said original controller firmware code image from said original controller firmware code image;
- calculating, by said currently operating simplex array controller, a calculated entire image CRC value for an entirety of said stored original controller firmware code image;
- determining, by said currently operating simplex array controller, that said original controller firmware code image is invalid if said stored entire image CRC value does not match said calculated entire image CRC value;
- reading, by said original simplex array controller, a stored sub-section CRC value for each sub-section of said original controller firmware code image from a header in said original controller firmware code image associated with each sub-section of said original firmware code image;
- calculating, by said currently operating simplex array controller, a calculated sub-section CRC value for each sub-section of said original controller firmware code image using a sub-section CRC polynomial, said sub-section CRC polynomial being separate and distinct from said entire image CRC polynomial;
- determining, by said currently operating simplex array controller, that said original controller firmware code image is invalid if said stored sub-section CRC values do not match said calculated sub-section CRC values; and
- determining, by said currently operating simplex array controller, that said original controller firmware code image is valid if said valid flag is valid, said stored entire image CRC value does match said calculated entire image CRC value, and said stored sub-section CRC values do match said calculated sub-section CRC values.

6. The method of claim 1 wherein said step of creating and storing said original controller firmware code image further comprises:
- creating said original firmware code image on said repository storage device as a computer readable file stored on said firmware repository storage device by said original simplex array controller;
- setting a valid flag in said original controller firmware code image to invalid by said original simplex array controller;
- writing firmware code image content to said original firmware code image by said original simplex array controller;
- calculating sub-section Cyclic Redundancy Check (CRC) values for each sub-section of said original firmware code image using a sub-section CRC polynomial by said original simplex array controller;
- writing, by said original simplex array controller, each calculated sub-section CRC value of said calculated sub-section CRC values to a header in said original controller firmware code image associated with each calculated sub-section CRC value;
- calculating an entire image CRC value across an entirety of said original controller firmware code image using an entire image CRC polynomial by said original simplex array controller, said entire image CRC polynomial being distinct and separate from said sub-section CRC polynomial;
- writing, by said original simplex array controller, said calculated entire image CRC value to said original controller firmware code image; and
- setting said valid flag in said original controller firmware code image to valid by said original simplex array controller.

7. The method of claim 1 further comprising:
- monitoring, by said original simplex array controller, said original controller firmware code image for file corruption; and
- recreating, by said original simplex array controller, said original controller firmware code image if file corruption is found.

8. The method of claim 1 further comprising:
- monitoring, by said original simplex array controller, said firmware repository storage device for failure, removal, and predictive failure indicating that said firmware repository storage device is not available; and
- moving, by said original simplex array controller, said original controller firmware code image to a new firmware repository storage device if said firmware repository storage device is not available.

9. The method of claim 1 further comprising:
- monitoring, by said original simplex array controller, said firmware revision information on said currently operating original simplex array controller for changes; and
- recreating, by said original simplex array controller, said original controller firmware code image if said firmware revision information on said currently operating original simplex array controller changes.

10. The method of claim 1 wherein said step of replacing said currently running revision of firmware on said replacement simplex array controller is performed regardless of whether said currently running revision of firmware on said replacement simplex array controller is a newer firmware revision than said original controller revision of firmware stored in said original controller firmware image.

11. A simplex array storage controller that synchronizes firmware between a replacement simplex array controller with firmware of an original simplex array controller for a storage array controlled by simplex array controller comprising:
- a firmware code image creation and storage sub-system that creates and stores on a firmware repository storage device an original controller firmware code image that contains an original controller revision of firmware of firmware that is running on said simplex array controller when said simplex array controller is determined to be operating as said original simplex array controller and original controller firmware revision information about said original controller revision of firmware running on said simplex array controller when said simplex array controller is determined to be operating as said original simplex array controller, said firmware repository storage device being comprised of at least one storage device of an array of storage devices controlled by said simplex array controller;
- a synchronize and update firmware sub-system that determines that said simplex array controller, when said simplex array controller is determined to be operating as said replacement simplex array controller, is running different firmware than said original simplex array controller was running when said original controller firmware image was created and stored by comparing replacement controller firmware revision information of firmware currently running on said replacement simplex array controller when said simplex array controller is determined to be operating as said replacement simplex array controller with said original controller firmware revision information stored in said original controller firmware code image, and that replaces said currently running revision of firmware on said simplex array controller when said simplex array controller is determined to be operating as said replacement simplex array controller with said original controller revision of firmware stored in said original controller firmware code image.

12. The simplex array storage controller of claim 11 further comprising a firmware repository device selection sub-system that selects said at least one storage device comprising said firmware repository storage device from said array of storage devices controlled by said simplex array controller when said simplex array controller is determined to be operating as said original simplex array controller based on Quality of Service (QOS) criteria of each storage controller of said array of storage controllers.

13. The simplex array storage controller of claim 11 further comprising a replacement controller detection sub-system that reads configuration database controller identification information from an array configuration database associated with said array of storage devices, obtains currently operating controller identification information from said currently operating simplex array storage controller, compares said configuration database controller identification information with said currently operating controller identification information, determines that if said configuration database controller identification information does not match said currently operating controller identification information that said currently operating simplex array controller is operating as said replacement simplex array controller, and determines that if said configuration database controller identification information does match said currently operating controller identification information that said currently operating simplex array controller is operating as said original simplex array controller.

14. The simplex array storage controller of claim 11 wherein said synchronize and update firmware sub-system further comprises
reading said original controller firmware revision information from said original controller firmware code, obtaining said replacement controller firmware revision information from said currently running simplex array controller when determined to be operating as said replacement simplex array controller, comparing said original controller firmware revision information to said replacement controller firmware revision information, determining that said replacement simplex array controller is running different firmware than said original simplex array controller if said original controller firmware revision information does not match said replacement controller firmware revision information, uploading said original controller revision of firmware from said original controller firmware code image to said currently running simplex array controller when determined to be operating as said replacement simplex array controller, installing said original controller revision of firmware on said currently running simplex array controller when determined to be operating as said replacement simplex array controller, and rebooting said simplex array controller when determined to be operating as said replacement simplex array controller in order to activate and run said uploaded and installed original controller revision of firmware on said simplex array controller.

15. The simplex array storage controller of claim 11 wherein said firmware code image creation and storage sub-system further comprises creating said original firmware code image on said repository storage device as a computer readable file stored on said firmware repository storage device; setting a valid flag in said original controller firmware code image to invalid, writing firmware code image content to said original firmware code image, calculating sub-section Cyclic Redundancy Check (CRC) values for each sub-section of said original firmware code image using a sub-section CRC polynomial, writing each calculated sub-section CRC value of said calculated sub-section CRC values to a header in said original controller firmware code image associated with each calculated sub-section CRC value, calculating an entire image CRC value across an entirety of said original controller firmware code image using an entire image CRC polynomial where said entire image CRC polynomial is distinct and separate from said sub-section CRC polynomial, writing said calculated entire image CRC value to said original controller firmware code image, and setting said valid flag in said original controller firmware code image to valid by said original simplex array controller.

16. The simplex array storage controller of claim 14 wherein prior to reading from and uploading from said original controller firmware code image said simplex array validates said original controller firmware code image by reading a valid flag from said original controller firmware code image, determining that said original controller firmware code image is invalid if said valid flag is invalid, reading a stored entire image CRC value for said original controller firmware code image from said original controller firmware code image, calculating a calculated entire image CRC value for an entirety of said stored original controller firmware code image, determining that said original controller firmware code image is invalid if said stored entire image CRC value does not match said calculated entire image CRC value, reading a stored sub-section CRC value for each sub-section of said original controller firmware code image from a header in said original controller firmware code image associated with each sub-section of said original firmware code image, calculating a calculated sub-section CRC value for each sub-section of said original controller firmware code image using a sub-section CRC polynomial where said sub-section CRC polynomial is separate and distinct from said entire image CRC polynomial, determining that said original controller firmware code image is invalid if said stored sub-section CRC values do not match said calculated sub-section CRC values, and determining that said original controller firmware code image is valid if said valid flag is valid, said stored entire image CRC value does match said calculated entire image CRC value, and said stored sub-section CRC values do match said calculated sub-section CRC values.

17. The simplex array storage controller of claim 11 further comprising a monitoring sub-system that monitors said original controller firmware code image for file corruption, and recreates said original controller firmware code image if file corruption is found.

18. The simplex array storage controller of claim 11 further comprising firmware code image creation and storage sub-system that monitors said firmware repository storage device for failure, removal, and predictive failure indicating that said firmware repository storage device is not available, and moves said original controller firmware code image to a new firmware repository storage device if said firmware repository storage device is not available.

19. The simplex array storage controller of claim 11 further comprising a monitoring sub-system that monitors said firmware revision information on said currently operating simplex array controller for changes, and recreates said original controller firmware code image if said firmware revision information on said currently operating simplex array controller changes.

20. The simplex array storage controller of claim 11 wherein said replacing of said currently running revision of firmware on said simplex array controller is performed regardless of whether said currently running revision of firmware on said simplex array controller is a newer firmware revision than said original controller revision of firmware stored in said original controller firmware image.

* * * * *